US008164128B2

(12) United States Patent
Kanakasabapathy et al.

(10) Patent No.: US 8,164,128 B2
(45) Date of Patent: Apr. 24, 2012

(54) MAGNETIC DEVICES AND TECHNIQUES FOR FORMATION THEREOF

(75) Inventors: Sivananda K. Kanakasabapathy, Hopewell Junction, NY (US); Michael C. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 631 days.

(21) Appl. No.: 11/926,845

(22) Filed: Oct. 29, 2007

(65) Prior Publication Data

US 2008/0043379 A1 Feb. 21, 2008

Related U.S. Application Data

(62) Division of application No. 11/209,951, filed on Aug. 23, 2005, now Pat. No. 7,399,646.

(51) Int. Cl.
*H01L 29/94* (2006.01)
(52) U.S. Cl. ........ 257/295; 257/296; 257/297; 257/298; 257/299; 257/300; 257/301
(58) Field of Classification Search .......... 257/295–301, 257/E29.164–E29.165
See application file for complete search history.

(56) References Cited

U.S. PATENT DOCUMENTS

| | | | |
|---|---|---|---|
| 5,640,343 A | 6/1997 | Gallagher et al. | |
| 6,165,803 A * | 12/2000 | Chen et al. | 438/3 |
| 6,713,802 B1 | 3/2004 | Lee | |
| 6,783,999 B1 | 8/2004 | Lee | |
| 6,812,040 B2 | 11/2004 | Kyler et al. | |
| 7,205,164 B1 * | 4/2007 | Geha et al. | 438/3 |
| 2005/0090119 A1 * | 4/2005 | Lee | 438/720 |

OTHER PUBLICATIONS

W. Reohr et al., "Memories of Tomorrow," IEEE Circuits & Devices Magazine, vol. 18, No. 5, pp. 17-27, Sep. 2002.
S. Tehrani et al., "Magnetoresistive Random Access Memory Using Magnetic Tunnel Junctions," Proceedings of the IEEE, vol. 91. No. 5, pp. 703-714, May 2003.
B.N. Engel et al, "The Science and Technology of Magnetoresistive Tunneling Memory," IEEE Transactions on Nanotechnology, vol. 1, No. 1, pp. 32-38, Mar. 2002.
A.R. Sitaram et al., "A 0.18 μm Logic-Based MRAM Technology for High Performance Nonvolatile Memory Applications," Proceedings of Symposium on VLSI Technology Digest of Technical Papers, pp. 15-16, 2003.
Y. Wang et al., "Ultrahigh-Selectivity Silicon Nitride Etch Process Using an Inductively Coupled Plasma Source," Journal of Vacuum Science and Technology A, vol. 16, Issue 3, pp. 1582-1587, May 1998.

* cited by examiner

*Primary Examiner* — Cuong Q Nguyen
*Assistant Examiner* — Tran Tran
(74) *Attorney, Agent, or Firm* — Louis J. Percello; Ryan, Mason & Lewis, LLP

(57) ABSTRACT

Techniques for forming a magnetic device are provided. In one aspect, a magnetic device includes a magnetic tunnel junction and a dielectric layer formed over at least a portion of the magnetic tunnel junction. The dielectric layer is configured to have an underlayer proximate to the magnetic tunnel junction, and an overlayer on a side of the underlayer opposite the magnetic tunnel junction. The magnetic device further includes a via hole running substantially vertically through the dielectric layer and being self-aligned with the magnetic tunnel junction.

20 Claims, 5 Drawing Sheets

400

500

600

MAGNETIC DEVICES AND TECHNIQUES FOR FORMATION THEREOF

CROSS-REFERENCE TO RELATED APPLICATION(S)

This application is a divisional of U.S. application Ser. No. 11/209,951 filed on Aug. 23, 2005, the disclosure of which is incorporated herein by reference.

FIELD OF THE INVENTION

The present invention relates to magnetic devices and, more particularly, to improved magnetic device configurations and techniques for the formation thereof.

BACKGROUND OF THE INVENTION

Magnetic memory devices, such as magnetic random access memory (MRAM) devices, use magnetic memory cells to store information. Information is stored in a magnetic memory cell as the orientation of the magnetization of a free layer (FL) in the magnetic memory cell as compared to the orientation of the magnetization of a pinned layer (PL) in the magnetic memory cell. The magnetization of the FL may be oriented parallel or anti-parallel to the PL, representing either a logic "0" or a "1." One type of memory cell, a magnetic tunnel junction (MTJ), comprises a FL and a PL separated by a tunnel barrier, which typically comprises aluminum oxide.

The resistance of the device depends on the direction of magnetization of the FL relative to the direction of magnetization of the PL. Thus, the state of the device can be sensed by measuring its resistance.

Magnetic memory devices are described, for example, in U.S. Pat. No. 5,640,343 issued to Gallagher et al., entitled "Magnetic Memory Array Using Magnetic Tunnel Junction Devices in the Memory Cells" (hereinafter "Gallagher"), the disclosure of which is incorporated by reference herein. Specifically, Gallagher describes a technique comprising a mutually perpendicular array of metal wires with an MTJ placed at the intersection of two wires. An MTJ of interest may be uniquely addressed in the array by the two wires that intersect over it. See, for example, W. Reohr et al., *Memories of Tomorrow*, IEEE CIRCUITS & DEVICES MAGAZINE pgs. 17-27 (September 2002), S. Tehrani et al., *Magnetoresistive Random Access Memory Using Magnetic Tunnel Junctions*, 91 PROC. OF THE IEEE, pgs. 703-714, No. 5 (May 2003), B. N. Engel et al., *The Science and Technology of Magnetoresistive Tunneling Memories*, 1 IEEE TRANS. ON NANOTECH., pgs. 32-38, No. 1 (March 2002) and A. R. Sitaram et al., *A 0.18 µm Logic-based MRAM Technology for High Performance Nonvolatile Memory Applications*, PROC. OF THE VLSI SYMPOSIUM 2003, the disclosures of which are incorporated by reference herein.

Typically, an MTJ stack is only a few hundred Angstroms thick and the successive metal wires that sandwich the MTJs are made from standard Back End of Line (BEOL) processing that is compatible with Complimentary Metal-Oxide Semiconductor (CMOS) fabrication. The metal wires typically need to be separated from each other by a greater distance than the thickness of the MTJ between them, in order to prevent inter-level shorts and to minimize their inter-layer capacitance. Several techniques have been employed to achieve proper separation of the metal wires.

For example, a metal stud located on the top of an MTJ can aid in spatially separating the metal wires from each other, while at the same time providing an electrical connection to the MTJ. According to this technique, the metal stud may also act as a hardmask during patterning of the MTJ. This approach, however, has several notable drawbacks. Etching of the metal stud involves the use of polymer(s) for sidewall passivation, which is difficult to remove from metal surfaces. As a result, performance limitations from the presence of ill-defined polymeric films can be expected in mass production. Further, it is hard to regulate the shape of the MTJ because it is defined, at least in part, by the shape of the metal stud, which is difficult to control in a long duration etch through a thick material.

Another approach involves employing a thin hardmask/cap layer on top of the MTJ and connecting the metal wire above the MTJ to the MTJ, by one or more vias extending downward from the metal wire to the thin hardmask/cap layer. This approach, however, also has several disadvantages, most notable of which is that, as the dimensions of MTJs decrease (as is the current trend), it becomes increasingly more difficult to properly align the via over the MTJ. Misaligned vias can result in shorting of the device.

Accordingly, there is a need for improved magnetic device configurations and techniques for the production thereof, wherein proper alignment of the metal wires with the MTJ is achieved, while at the same time maintaining proper spatial separation between the wires.

SUMMARY OF THE INVENTION

Techniques for forming a magnetic device are provided, in accordance with an illustrative embodiment of the present invention. In one aspect of the invention, a method of forming a via hole self-aligned with a magnetic device comprises the following steps. A dielectric layer is formed over at least a portion of the magnetic device. The dielectric layer is configured to have an underlayer proximate to the magnetic device which comprises a first material, and an overlayer on a side of the underlayer opposite the magnetic device which comprises a second material. The first material is different from the second material. In a first etching phase, a first etchant is used to etch the dielectric layer, beginning with the overlayer, and through the overlayer. In a second etching phase, a second etchant which is selective for etching the underlayer is used to etch the dielectric layer through the underlayer.

In accordance with another aspect of the present invention, a magnetic device includes a magnetic tunnel junction and a dielectric layer formed over at least a portion of the magnetic tunnel junction. The dielectric layer is configured to have an underlayer proximate to the magnetic tunnel junction, and an overlayer on a side of the underlayer opposite the magnetic tunnel junction. The magnetic device further includes a via hole running substantially vertically through the dielectric layer and being self-aligned with the magnetic tunnel junction.

These and other features and advantages of the present invention will become apparent from the following detailed description of illustrative embodiments thereof, which is to be read in connection with the accompanying drawings.

DETAILED DESCRIPTION OF THE INVENTION

Prior to describing the inventive aspects of the present invention, FIGS. 1 and 2, directed to conventional magnetic tunnel junction (MTJ) production techniques, will be described. It is to be understood that the various layers and/or regions shown in the accompanying figures may not be drawn to scale. Furthermore, one or more semiconductor layers of a type commonly used in such integrated circuit structures may not be explicitly shown in a given figure for ease of explanation. This does not imply that the semiconductor layers not explicitly shown are omitted in the actual integrated circuit device.

Figure 1:
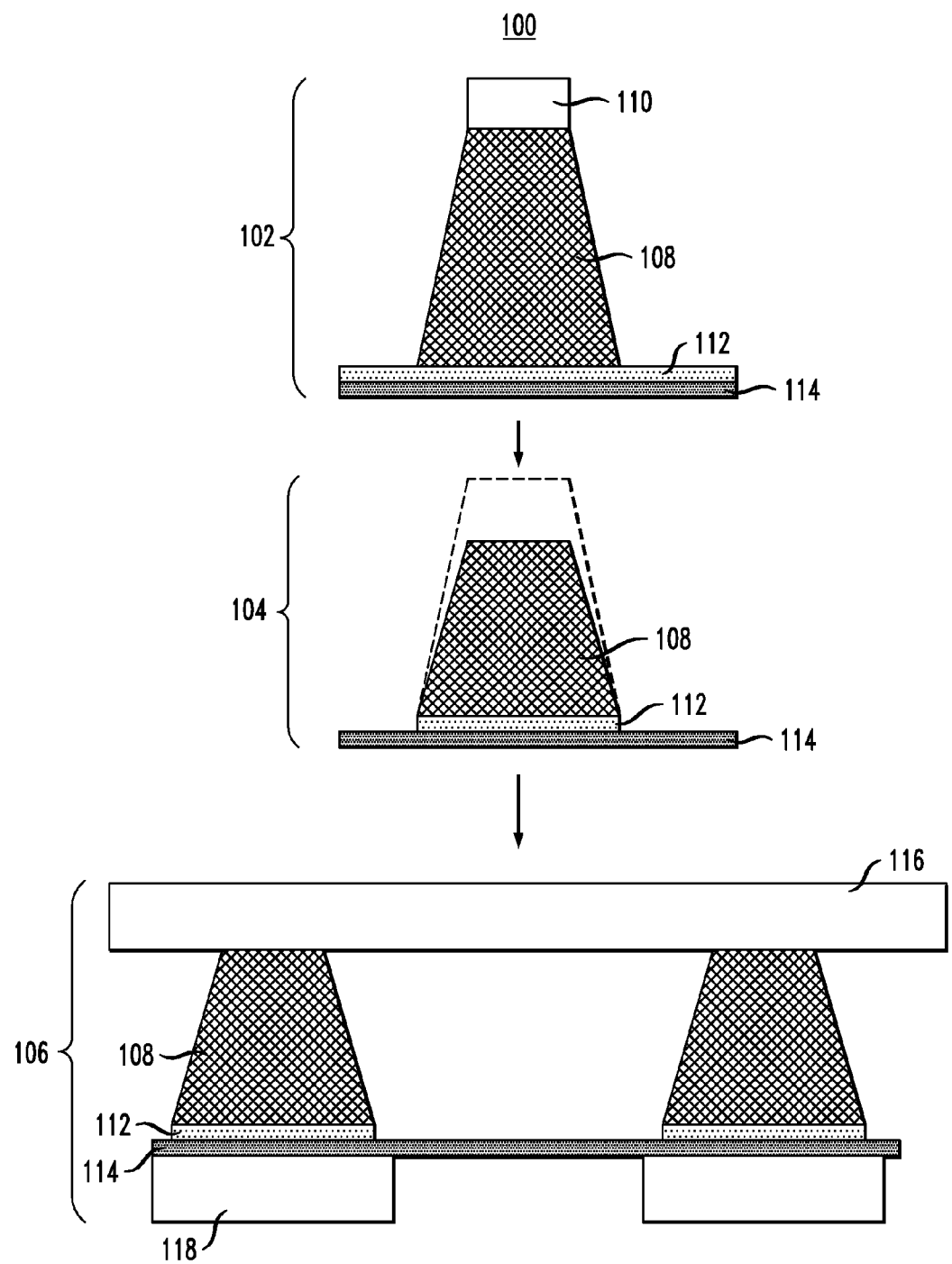
FIG. 1 is a diagram illustrating a conventional methodology for fabricating a magnetic tunnel junction (MTJ).

FIG. 1 is a diagram illustrating conventional methodology 100 for fabricating an MTJ. Techniques similar to methodology 100 are described, for example, in U.S. Pat. No. 6,783,999 issued to Lee, entitled "Subtractive Stud Formation for MRAM Manufacturing," the disclosure of which is incorporated by reference herein. In step 102, an MTJ precursor structure is provided, which comprises MJT stack layer 112 on a side of metal layer 114. Metal layer 114 serves to connect the MTJ to a metal wire beneath the MTJ (see step 106 below).

Although not shown in FIG. 1 for ease of depiction, MTJ stack layer 112 typically comprises more than one layer. For example, MTJ stack layer 112 may comprise at least two magnetic layers separated by at least one barrier layer therebetween. MTJ stack layer 112, i.e., each of the layers comprising MTJ stack layer 112, may be deposited as blanket films.

Metal contact stud 108 is deposited on a side of MTJ stack layer 112 opposite metal layer 114. Metal contact stud 108 serves as both a hardmask during etching of MTJ stack layer 112 and as an electrical contact for the MTJ to a metal wire above the device, see steps 104 and 106, respectively.

A lithographically defined mask 110 is preferably deposited on a side of metal contact stud 108 opposite MTJ stack layer 112. Lithographic mask 110, which may comprise photoresist or an alternative mask material, serves at least in part to protect metal contact stud 108 during a subsequent processing step and is later removed, such as in step 104 described below.

In step 104, using metal contact stud 108 as a hardmask, MTJ stack layer 112 is patterned. As a result of the patterning process, a portion of metal contact stud 108 is degraded, e.g., as indicated by dash marks.

In step 106, the MTJ formed is made part of a magnetic device. Specifically, the MTJ formed is sandwiched between metal wires 116 and 118. Metal wire 116 comprises a word line overlying the MTJ device. Metal wire 118 comprises a bit line underlying the MTJ. As shown in step 106, metal contact stud 108 acts as an electrical conduit between metal wire 116 and MTJ stack layer 112. Metal contact stud 108 also serves to spatially separate metal wires 116 and 118.

The above methodology, however, is difficult to implement in mass-production primarily due to inherent characteristics of the metal etching process and the inability to consistently control the shape of the device produced.

Figure 2:
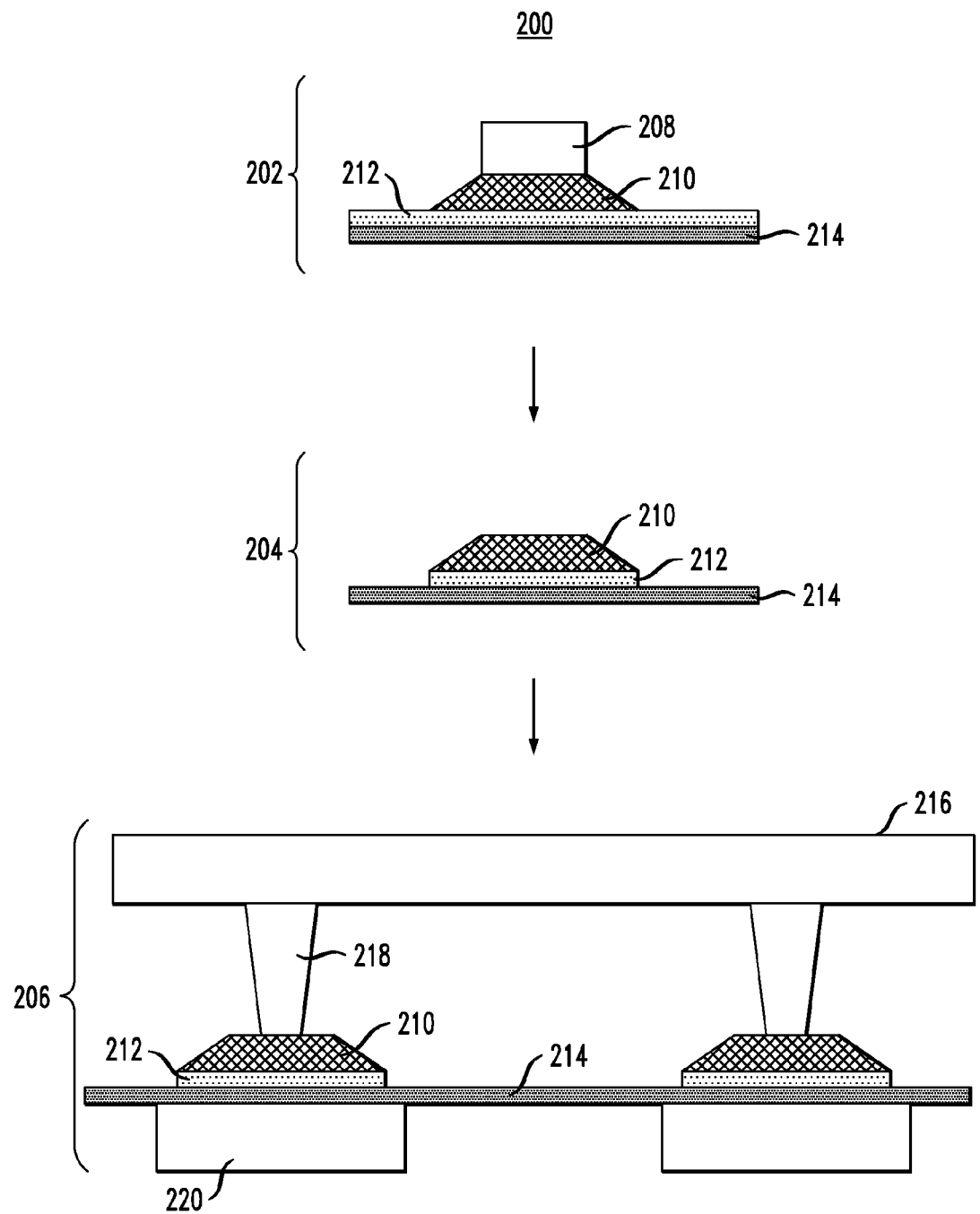
FIG. 2 is a diagram illustrating another conventional methodology for fabricating an MTJ.

FIG. 2 is a diagram illustrating a conventional methodology 200 for fabricating an MTJ. In step 202, an MTJ precursor structure is provided which comprises MJT stack layer 212 on a side of metal layer 214. Metal layer 214 serves to connect the MTJ to a metal wire beneath the MTJ (see step 204 below). As described above, although not shown in FIG. 2 for ease of depiction, MTJ stack layer 212 typically comprises more than one layer. For example, MTJ stack layer 212 may comprise at least two magnetic layers separated by at least one barrier layer therebetween. MTJ stack layer 212 (i.e., each of the layers comprising MTJ stack layer 212) may be deposited as a blanket film.

A thin hardmask/cap layer 210 is deposited on a side of MTJ stack layer 212 opposite metal layer 214. In determining how "thin" to form hardmask/cap layer 210, a figure of merit for comparison may be based on a cross-sectional distance between wiring levels needed to prevent electrical shorts and high interlayer capacitance in the device. If the figure of merit is arbitrarily defined as about 25 percent of this distance, then a thin hardmask would preferably be less than this figure of merit. Thin hardmask/cap layer 210 will preferably serve as part of an electrical contact between MTJ stack layer 212 and a metal wire above the device (see step 206 below).

A lithographically defined mask 208 is preferably deposited on a side of thin hardmask/cap layer 210 opposite MTJ stack layer 212. Lithographic mask 208, which may comprise photoresist or an alternative mask material, serves at least in part to protect thin hardmask/cap layer 210 during a subsequent processing step and is later removed, such as in step 204 described below.

In step 204, MTJ stack layer 212 is patterned and lithographic hardmask 208 is removed. In step 206, the MTJ formed is made part of a magnetic device. Namely, the MTJ formed is situated between metal wires 216 and 220 such that metal layer 214 is in electrical contact with metal wire 220. Via 218 provides electrical contact between thin hardmask/cap layer 210 and metal wire 216.

The above methodology, however, limits the scalability of the device. For example, as the dimensions of the device are decreased, the area of thin hardmask/cap layer 210 for via 218 to make contact with becomes increasingly smaller. Thus, aligning components to form a proper electrical contact is difficult. Misalignments may result in shorting of the device.

Figure 3:
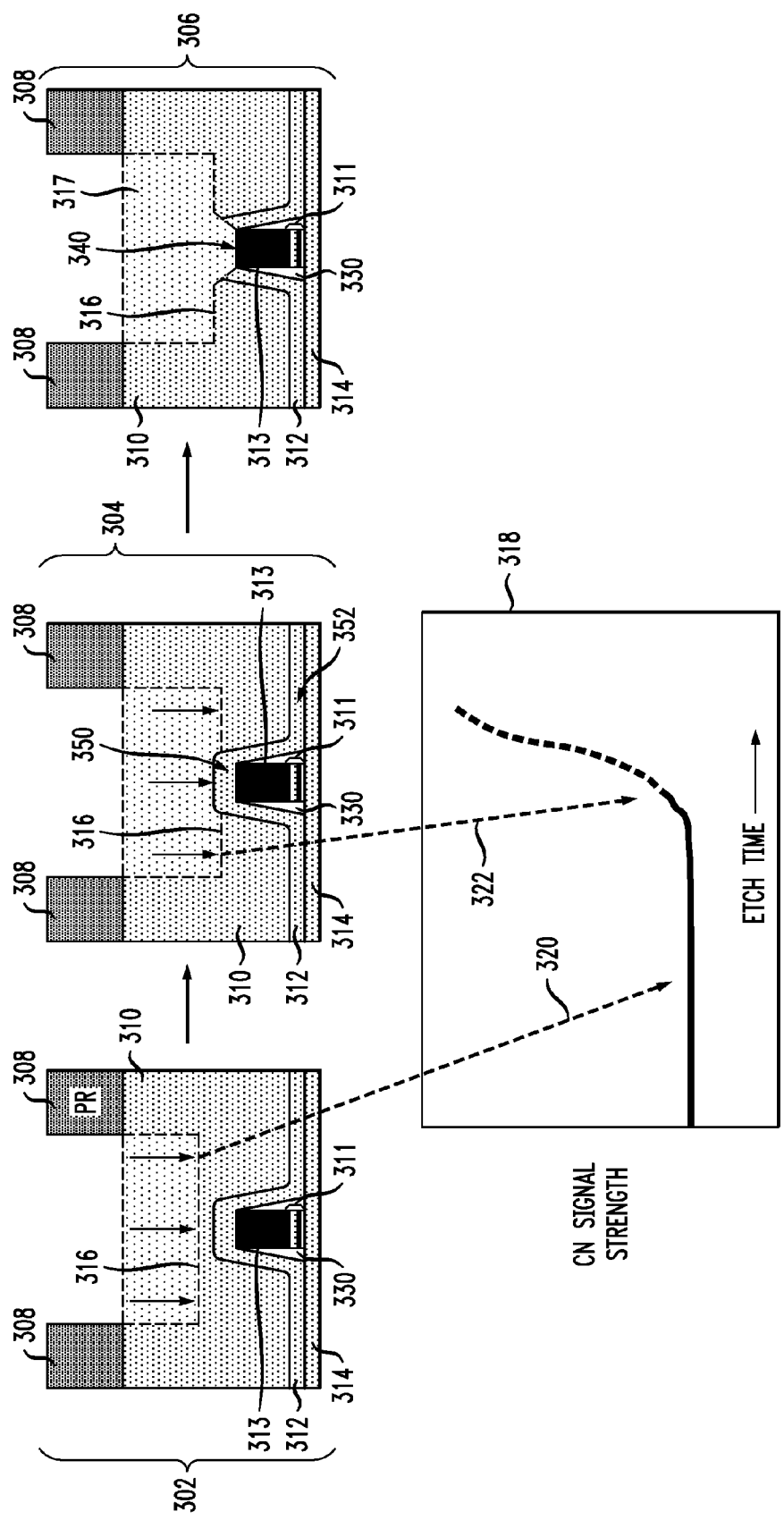
FIG. 3 is a diagram illustrating an exemplary methodology for forming a magnetic device according to an embodiment of the present invention.

FIG. 3 is a diagram illustrating an exemplary methodology 300 for forming a magnetic device, in accordance with one embodiment of the present invention. In step 302, an MTJ precursor structure is provided, shown in cross-sectional form, which comprises MTJ stack layer 311 formed on a side of metal layer 314. Although not shown in FIG. 3 for ease of depiction, MTJ stack layer 311 may comprise more than one layer. For example, MTJ stack layer 311 may comprise at least two magnetic layers separated by at least one barrier layer therebetween. MTJ stack layer 311, or each of the layers comprising MTJ stack layer 311, may be deposited as blanket films. Metal layer 314 will serve to connect the MTJ to a metal wire below the device (not shown).

A metal contact stud 313 is preferably formed on a side MTJ stack layer 311 opposite metal layer 314. As will be described in detail below, the techniques illustrated in FIG. 3 may be employed to form a self-aligned via on the top of the structure comprising metal contact stud 313 and MTJ stack layer 311.

An overlayer 310 and an underlayer 312 form an interlevel dielectric (ILD) over metal layer 314 and the structure comprising metal contact stud 313 and MTJ stack layer 311. As shown in FIG. 3, the ILD is formed proximate to the topmost metal layer of the device, and therefore is referred to herein as a metal terminus (MT) ILD. Further, the techniques described herein may comprise steps performed during trench formation for damascene metallization of the MT ILD.

According to an exemplary embodiment of the invention, underlayer 312 serves to promote adhesion to the layers beneath it, e.g., to metal layer 314, and also to act as a diffusion barrier. Suitable materials for forming underlayer 312 include, but are not limited to, silicon nitride (SiN), silicon carbon nitride (SiCN) and combinations comprising at least one of the foregoing materials. Suitable materials for forming overlayer 310 include, but are not limited to, silicon dioxide ($SiO_2$).

A photoresist (PR) layer 308 is preferably deposited on a side of overlayer 310 opposite underlayer 312. As shown in step 302, during formation of a hole for the via, PR layer 308 is first patterned to approximately the desired lateral (e.g., horizontal) dimensions of the via through overlayer 310. Overlayer 310 is subsequently etched. Suitable etchants for etching overlayer 310 include, but are not limited to, carbon-based plasma etches, such as $CF_4$-based plasma etches.

As will be described in detail below, the progression of the etch through the ILD is preferably monitored by observing an optical emissions trace during etching. Any suitable techniques for monitoring optical emissions resulting from etching may be employed, as will be known by those skilled in the art. For example, according to one exemplary embodiment, an optical imaging spectrometer may be employed to observe optical emissions from the etch discharge. Specifically, as will be described in detail below, when the etch progresses to the point where it traverses the boundary between overlayer 310 and underlayer 312, the optical emissions will change, and this change in optical emissions can be detected.

By way of example only, when a carbon-based plasma etch is employed and overlayer 310 comprises $SiO_2$ and underlayer 312 comprises SiN, during etching of overlayer 310 there is no carbon/nitrogen interaction, as no nitrogen in present in the overlayer 310. However, once an etch front crosses the interface between overlayer 310 and underlayer 312, the plasma etch will react with underlayer 312, which contains nitrogen, and an optical indicator, such as, for example, cyanide (CN), will be formed in the etch chamber. Cyanide emits a strong light of a characteristic wavelength, and is therefore easily detected. The etch front may be defined as the point at which the etch plasma comes into contact with the material that is intended to be etched.

Exemplary optical emission spectra 318, which can be used to detect the etch front, indicates this transition point. Specifically, optical emission spectra 318 shows a significant increase in cyanide signal strength when the etch front traverses the interface between overlayer 310 and underlayer 312, as indicated, for example, by a comparison between the spectra after the point indicated by arrow 320 and the spectra after the point indicated by arrow 322. When the cyanide signal just begins to rise (e.g., at arrow 322), this indicates that the etch front has contacted the silicon nitride in a "raised" (Up) portion of the underlayer 312 (e.g., at 350) and is away from a "lower" (Down) portion of the underlayer (e.g., at 352). As used herein, the "raised" and "lower" portions 350, 352, of underlayer 312 are intended to refer to the cross-sectional height of the underlayer when referenced to a substantially horizontal (planar) surface, such as, for example, metal layer 314, the raised portion 350 being further from the planar reference surface (e.g., 314) compared to the lower portion 352. The objective here is to punch through the silicon nitride in the raised portion 350 without penetrating the lower portion 352, since the former produces a desirable contact region and the latter will electrically short out the device.

In accordance with optical emission spectra 318, step 304 shows the etch front reaching a portion of underlayer 312 that passes over the structure comprising metal contact stud 313 and MTJ stack layer 311. Since the topography of the etch front at this point is no longer substantially flat, the cyanide signal starts to rise sharply once the material of underlayer 312 is penetrated by the etch front. Once this rise in cyanide signal is detected, etching is preferably ceased. At this instant, the etch front is substantially removed from the metal in the field area. A second chemistry is then used to continue the etch.

According to an exemplary embodiment of the invention, the second etch chemistry chosen is highly selective to etching underlayer 312. Specifically, the second etch chemistry should etch primarily underlayer 312 to the exclusion of overlayer 310. For example, a suitable etch chemistry for use as the second etchant includes, but is not limited to, $CH_3F/O_2$ chemistries, which selectively etch silicon nitride and only marginally etch silicon dioxide.

As shown in step 306, the second etch chemistry selective for underlayer 312 can serve to etch a selective via hole 340 through the underlayer and above at least a portion of the structure comprising metal contact stud 313 and MTJ stack layer 311. Because of the variable selectivities of the etchants employed, the via hole 340 which is formed will be self-aligned with the structure comprising metal contact stud 313 and MTJ stack layer 311. Due to the nature of the process, it is scalable. Specifically, the techniques described herein may be employed even if the device components are scaled-down in size.

Conventional damascene processes may then be used to form metal lines, such as, for example, by a trench 316 and filling the trench with a metal 317, or an alternative electrically conductive material. The trench 316 may be formed using conventional trenching techniques (e.g., etching, etc.). A via may be formed between the metal lines and MTJ stack layer 311, so as to electrically connect the MTJ to the metal lines.

Additionally, according to another exemplary embodiment of the present invention, sidewall spacer material 330 may be deposited around the metal contact stud 313/MTJ stack layer 311. This spacer material 330 is preferably selected, with regard to the second etch chemistry chosen, to have a low etch rate compared to the underlayer 312. Suitable spacer materials include, but are not limited to, those materials suitable for forming the overlayer 310, such as $SiO_2$. The inclusion of a spacer material helps prevent the second etch chemistry from spiking along the sides of the metal contact stud 313/MTJ stack layer 311, and thus prevents shorting of the device.

Spiking, also referred to as spire formation, may be said to occur when a film is deposited on a prior topography. Specifically, by way of example only, when the thickness of a deposited film atop the raised portion 350 of the silicon nitride underlayer 312 is greater than the thickness of the deposited film atop the lower portion 352 of the underlayer, spiking or spire formation occurs (e.g., high density plasma deposition of silicon nitride).

Figure 4:
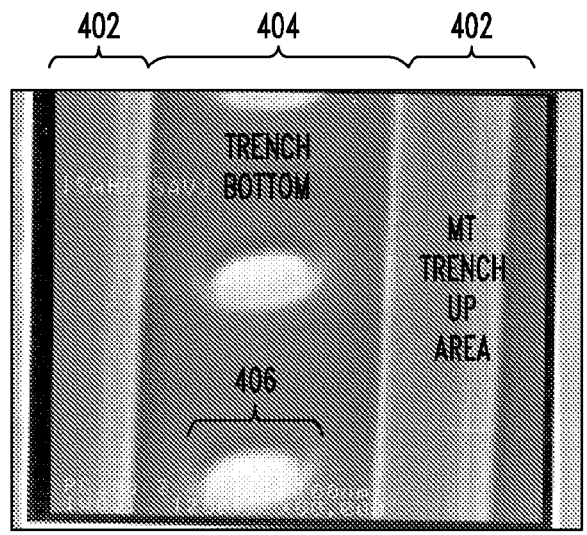
FIG. 4 is an electron micrograph image illustrating a self-aligned via hole patterned in accordance with the techniques shown in FIG. 3 according to an embodiment of the present invention.

In FIG. 4, electron micrograph image 400 illustrates an exemplary self-aligned via patterned according to the techniques of the present invention described herein in conjunction with FIG. 3. Specifically, micrograph image 400 provides a top-down view of, for example, the magnetic device shown in step 306 of FIG. 3, with PR layer 308 removed. In micrograph image 400, regions 402 comprise the unetched surfaces of overlayer 310 (e.g., as defined by PR layer 308). Region 404 comprises the etched regions of overlayer 310 and underlayer 312. Specifically, region 406 comprises the etched region of underlayer 312.

Figure 5:
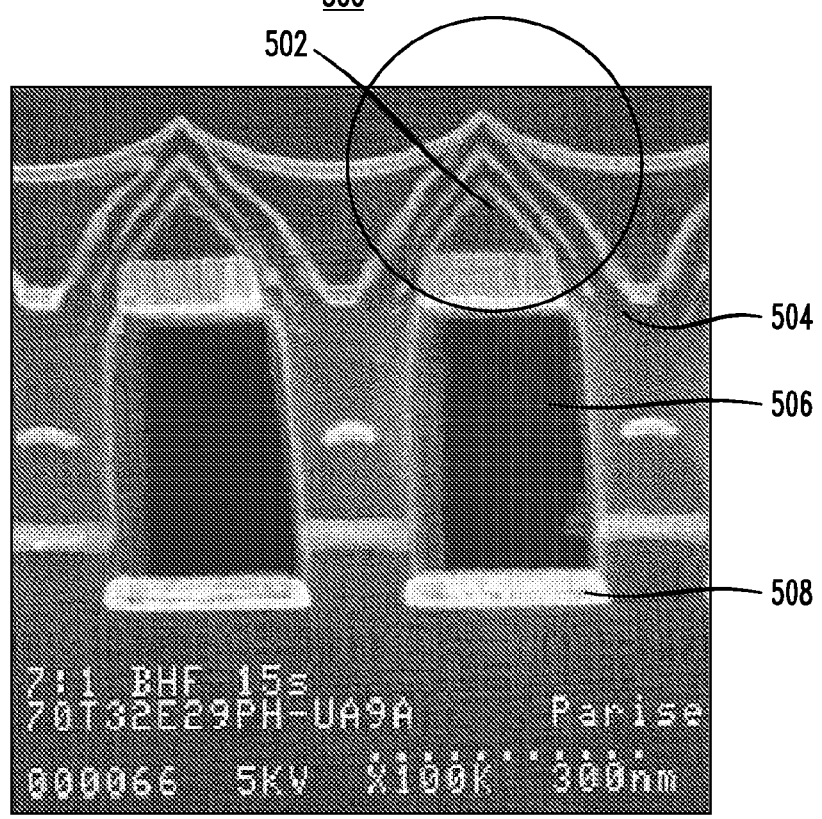
FIG. 5 is an electron micrograph image of an underlayer formed by high-density plasma, chemical vapor deposition (HDP CVD), according to an embodiment of the present invention.

According to another exemplary embodiment of the present invention, high-density plasma, chemical vapor deposition (HDP CVD) is used to deposit the underlayer, e.g., underlayer 312 of FIG. 3. Use of HDP CVD to deposit the underlayer results in the formation of spires, or similar upward tapering structure. For example, FIG. 5 is an electron micrograph image 500 depicting a cross section of at least a portion of an exemplary semiconductor structure formed in accordance with the invention. An underlayer 504 of the illustrative structure, which comprises a metal contact stud 506 formed above and proximate to a MTJ stack layer 508, is formed using a HDP CVD process. This structure is similar to that described above in conjunction with FIG. 3.

In electron micrograph image 500, spires 502 are shown formed in the underlayer 504. An advantage of this exemplary embodiment is that the spires 502 provide a greater duration for detecting the transition of the etch front from the overlayer to the underlayer. Since the spires cause the peak of the underlayer material to extend a further distance into the overlayer (e.g., above the structure comprising metal contact stud 506 and MTJ stack layer 508), a longer duration of cyanide optical emissions is present during etching to indicate that a change to the second etch chemistry should be made, as described above.

According to yet another exemplary embodiment of the present invention, the underlayer (e.g., underlayer 312 of FIG. 3) is used as a hardmask for patterning the MTJ stack layer (e.g., MTJ stack layer 311 of FIG. 3). This embodiment is shown in FIG. 6, which is a cross-sectional view illustrating an exemplary methodology 600 for forming a magnetic device, in accordance with the present invention.

Figure 6:
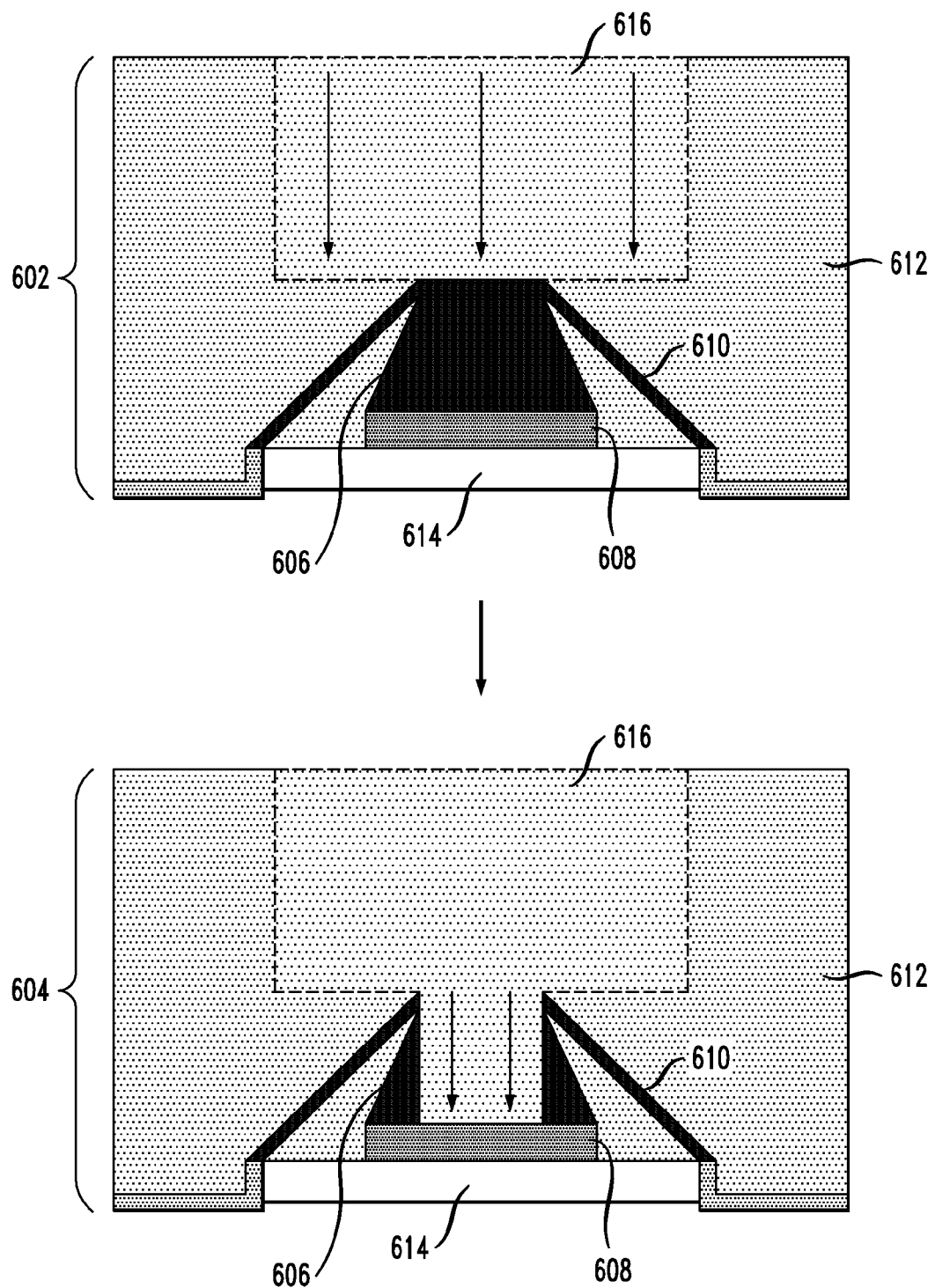
FIG. 6 is a diagram illustrating another exemplary methodology for forming a magnetic device according to an embodiment of the present invention.

With reference to FIG. 6, in step 602, an MTJ precursor structure is shown in cross-sectional form, which comprises an MTJ stack layer 608 formed on at least a portion of a top surface of a metal layer 614. Although not shown in FIG. 6 for ease of depiction, the invention contemplates that MTJ stack layer 608 may comprise more than one layer. For example, MTJ stack layer 608 may comprise at least two magnetic layers separated by at least one barrier layer therebetween. MTJ stack layer 608, or alternatively each of the layers comprising the MTJ stack layer, may be deposited as blanket films. Metal layer 614 preferably serves to connect the MTJ to a metal wire (not shown) formed below the device.

A dielectric layer 606 is preferably formed on a top surface of MTJ stack layer 608, opposite metal layer 614. According to one exemplary embodiment of the invention, dielectric layer 606 serves as a hardmask during patterning of MTJ stack layer 608. According to the techniques of the invention described herein, the term "hardmask" is used to refer to any non-photoresist material. For example, in this embodiment, as will be described in detail below, an underlayer 610 (e.g., comprising SiN) preferably serves as a hardmask.

An overlayer 612 and underlayer 610 form an ILL) over metal layer 614 and the structure comprising dielectric layer 606 and MTJ stack layer 608. As described herein, for example, in conjunction with FIG. 3, the ILD may comprise an MT ILD. Suitable materials for forming overlayer 612 include, but are not limited to, those materials described above in conjunction with the description of overlayer 310 shown in FIG. 3. Likewise, suitable materials for forming underlayer 610 include, but are not limited to, those materials previously described in conjunction with the description of underlayer 312 shown in FIG. 3.

As previously described in conjunction with FIG. 3, during etching of the ILD, carbon-based plasma etches, such as, for example, $CF_4$-based plasma etches, may be used to etch overlayer 612. The progression of the etch will be monitored, for example, by observing optical emissions traces, or an alternative detection methodology. When it is determined that the etch has progressed to the point where the etch front has traversed the boundary between overlayer 612 and underlayer 610, etching is preferably ceased.

A second etch is then performed using a second chemistry to continue the etch. The second etch chemistry is preferably chosen to selectively etch primarily underlayer 610 and dielectric layer 606, and to leave the remaining layers (e.g., overlayer 612) substantially unaffected. For example, a suitable etch chemistry for use in the second etch includes, but is not limited to, $CH_3F/O_2$ chemistries, which selectively etch silicon nitride and only marginally etch silicon dioxide. Alternatively, the second etch may employ a $NF_3/O_2/NH_3$ chemistry, which is ultra highly selective (e.g., greater than about 100:1) in favor of silicon nitride and against silicon oxide, as described, for example, in the article Ying Wang and Leroy Luo, "Ultrahigh-Selectivity Silicon Nitride Selective Etch Process Using Inductive Coupled Plasma Source," Journal of Vacuum Science and Technology (JVST) A, Vol. 16, Issue 3, pp. 1582-1587 (May 1998), the disclosure of which is incorporated by reference herein. Accordingly, dielectric layer 606 may comprise any material that may be etched by the second etch chemistry, including, but not limited to, the material used to form underlayer 610.

As shown in step 604, the second etch chemistry etches through underlayer 610 and through dielectric layer 606, stopping on, for example, a metal cap layer (not shown), or alternative etch stop layer, formed on a top surface of MTJ stack layer 608. Conventional dual, or triple damascene processes may then be used to metallize trench 616 to form metal lines, and a metal contact aligned with MTJ stack layer 608 (not shown).

The techniques described herein may be used for forming self-aligned vias for improved connections to MTJ devices, or alternative devices and/or structures, as may be employed, for example, in an MRAM array. These techniques are advantageously applicable even after scaling down of a device has been performed.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A magnetic device, comprising:
    a stack structure comprising a magnetic tunnel junction and a metal contact stud formed on top of the magnetic tunnel junction;
    an interlevel dielectric layer formed over the stack structure, the interlevel dielectric layer comprising a conformal underlayer formed over the stack structure covering each side entirely, and top surface of the stack structure, and a blanket overlayer formed on, and in contact with, a portion of the conformal underlayer that covers the side and top surfaces of the stack structure, wherein the blanket overlayer is not in direct contact with the magnetic tunnel junction; and
    a via hole running substantially vertically through the conformal underlayer and the blanket overlayer of the interlevel dielectric layer down to a surface of the metal contact stud and being self-aligned with the magnetic tunnel junction.

2. The device of claim 1, further comprising a first metal layer, the magnetic tunnel junction being formed on an upper surface of the first metal layer and being electrically connected to the first metal layer.

3. The device of claim 2, wherein the metal contact stud is formed on a side of the magnetic tunnel junction opposite the first metal layer.

4. The device of claim 1, further comprising a second metal contact stud formed through the via hole, the second contact stud being self-aligned to and in electrical connection with the metal contact stud of the stack structure.

5. The device of claim 1, further comprising a spacer material formed on at least a portion of respective sidewalls of the stack structure.

6. The device of claim 1, wherein the conformal underlayer comprises at least one of silicon nitride and silicon carbon nitride.

7. The device of claim 1, wherein the blanket overlayer comprises silicon dioxide.

8. The device of claim 1, further comprising a spacer material formed around at least a portion of at least one side of the magnetic device.

9. The device of claim 1, wherein the spacer material comprises silicon dioxide.

10. An integrated circuit including at least one magnetic device, the at least one magnetic device comprising:
   a stack structure comprising a magnetic tunnel junction and a metal contact stud formed on top of the magnetic tunnel junction;
   an interlevel dielectric layer formed over the stack structure, the interlevel dielectric layer comprising a conformal underlayer formed over the stack structure covering each side entirely, and top surface of the stack structure, and a blanket overlayer formed on, and in contact with, a portion of the conformal underlayer that covers the side and top surfaces of the stack structure, wherein the blanket overlayer is not in direct contact with the magnetic tunnel junction; and
   a via hole running substantially vertically through the conformal underlayer and the blanket overlayer of the interlevel dielectric layer down to a surface of the metal contact stud and being self-aligned with the magnetic tunnel junction.

11. The integrated circuit of claim 10, wherein the at least one magnetic device further comprises a first metal layer, the magnetic tunnel junction being formed on an upper surface of the first metal layer and being electrically connected to the first metal layer.

12. The integrated circuit of claim 11, wherein the metal contact stud is formed on a side of the magnetic tunnel junction opposite the first metal layer.

13. The integrated circuit of claim 10, wherein the at least one magnetic device further comprises a second metal contact stud formed through the via hole, the second contact stud being self-aligned to and in electrical connection with the metal contact stud of the stack structure.

14. The integrated circuit of claim 10, wherein the at least one magnetic device further comprises a spacer material formed on at least a portion of respective sidewalls of the stack structure.

15. The integrated circuit of claim 10, wherein the conformal underlayer comprises at least one of silicon nitride and silicon carbon nitride.

16. The integrated circuit of claim 10, wherein the blanket overlayer comprises silicon dioxide.

17. The integrated circuit of claim 10, wherein the at least one magnetic device further comprises a spacer material formed around at least a portion of at least one side of the magnetic device.

18. The integrated circuit of claim 10, wherein the spacer material comprises silicon dioxide.

19. The device of claim 1, wherein the underlayer comprises a first material and the overlayer comprises a second material, the first material being different from the second material.

20. The integrated circuit of claim 10, wherein the conformal underlayer comprises a first material and the blanket overlayer comprises a second material, the first material being different from the second material.

* * * * *